United States Patent
Hasegawa (10) Patent No.: US 8,127,188 B2
(45) Date of Patent: Feb. 28, 2012

(54) SEMICONDUCTOR INTEGRATED CIRCUIT AND DESIGN AUTOMATION SYSTEM

(75) Inventor: Tetsu Hasegawa, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 210 days.

(21) Appl. No.: 12/404,501

(22) Filed: Mar. 16, 2009

(65) Prior Publication Data

US 2009/0240997 A1 Sep. 24, 2009

(30) Foreign Application Priority Data

Mar. 18, 2008 (JP) .................................. 2008-69216

(51) Int. Cl.
*G01R 31/28* (2006.01)
*G06F 9/45* (2006.01)
*G06F 17/50* (2006.01)

(52) U.S. Cl. ........ 714/731; 714/726; 714/729; 714/741; 716/103; 716/104; 716/112

(58) Field of Classification Search .................. 714/726, 714/729, 731, 741; 716/103, 104, 112
See application file for complete search history.

(56) References Cited

U.S. PATENT DOCUMENTS

| | | | | |
|---|---|---|---|---|
| 5,166,604 A * | 11/1992 | Ahanin et al. | ............. | 324/750.3 |
| 5,285,153 A * | 2/1994 | Ahanin et al. | ............... | 324/73.1 |
| 6,539,536 B1 * | 3/2003 | Singh et al. | .................. | 716/102 |
| 7,055,077 B2 * | 5/2006 | Kiryu et al. | .................... | 714/726 |
| 7,076,709 B2 * | 7/2006 | Vermeulen et al. | ........... | 714/729 |
| 7,134,061 B2 * | 11/2006 | Agashe et al. | ................ | 714/726 |
| 7,222,276 B2 * | 5/2007 | Kashiwagi | ..................... | 714/726 |
| 7,346,822 B2 * | 3/2008 | Warren et al. | ................ | 714/731 |
| 7,383,481 B2 * | 6/2008 | Warren et al. | ................ | 714/726 |
| 7,613,972 B2 * | 11/2009 | Takeoka et al. | ............... | 714/731 |
| 7,698,613 B2 * | 4/2010 | Kudo | ............. | 714/731 |
| 7,739,568 B1 * | 6/2010 | Bertanzetti | ................... | 714/729 |
| 7,793,179 B2 * | 9/2010 | Sul | ................ | 714/726 |
| 7,840,861 B2 * | 11/2010 | Sul | ................ | 714/726 |
| 2005/0055614 A1 | 3/2005 | Yeh | | |
| 2006/0085707 A1 * | 4/2006 | Khan et al. | ..................... | 714/726 |
| 2007/0022339 A1 * | 1/2007 | Branch et al. | ................. | 714/726 |
| 2007/0198882 A1 * | 8/2007 | Namura et al. | ............... | 714/726 |
| 2008/0115005 A1 * | 5/2008 | Kamada | ....................... | 713/501 |
| 2008/0282122 A1 * | 11/2008 | Guettaf | ......................... | 714/731 |

OTHER PUBLICATIONS

Girard, Survey of Low-Power Testing of VLSI Circuits, IEEE Design & Test of Computers, May-Jun. 2002, pp. 82-92.

* cited by examiner

*Primary Examiner* — John J Tabone, Jr.
(74) *Attorney, Agent, or Firm* — Turocy & Watson, LLP (57) ABSTRACT

A scan chain circuit causes a plurality of flip-flops to function as shift registers during execution of a scan test and can execute a scan shift that serially transfers test pattern data for the scan test. A clock gating circuit controls output of a pulse of a clock signal supplied to the scan chain circuit in accordance with a clock gating signal, whereas disables the clock gating signal based on a logic of a scan enable signal authorizing the scan shift. A first clock gating circuit included in the clock gating circuit disables the clock gating signal during the scan shift based on the logic of the scan enable signal and also inverts the clock signal and outputs a result of inverting.

18 Claims, 9 Drawing Sheets

SEMICONDUCTOR INTEGRATED CIRCUIT AND DESIGN AUTOMATION SYSTEM

CROSS REFERENCE TO RELATED APPLICATION

This application is based on and claims the benefit of priority from prior Japanese Patent Application No. 2008-69216, filed on Mar. 18, 2008, the entire contents of which are incorporated herein by reference.

BACKGROUND OF THE INVENTION

1. Field of the Invention

The present invention relates to a semiconductor integrated circuit and a design automation system that automates design of a semiconductor integrated circuit.

2. Description of the Related Art

To test whether or not a semiconductor integrated circuit (hereafter referred to as "LSI") has been manufactured normally, a scan test method is generally used. A scan test is executed by substituting flip-flops (for convenience, "flip-flop" is hereafter referred to as "F/F") within an LSI by F/Fs having input/output terminals for a scan test called scan F/Fs. A plurality of such scan F/Fs are connected in series to form a scan chain structure within the LSI and a test pattern is inputted directly to the scan F/Fs from external terminals of the LSI. Moreover, data of the scan F/Fs is outputted directly to the external terminals of the LSI.

An LSI designed to enable execution of this kind of scan test can be treated as a combinational circuit even though it is a sequential circuit including scan F/Fs. Therefore, it is possible to automatically generate a test pattern by way of an ATPG (Automatic Test Pattern Generation) tool.

Generally, in a scan shift operation in the scan test, all of the F/Fs are directly controlled by a clock that is inputted from external terminals. To execute the scan shift operation without any faulty input or misreading of data, it is necessary that the clock of the serially connected F/Fs rises simultaneously. Even if an internally inverted clock is provided to the clock terminals of the scan F/F or an inverted edge scan F/F exists, it is possible to correctly execute a shift operation provided that those scan F/Fs are positioned at the head of the scan chain.

This scan design enables the LSI testing to be performed easily. However, during the scan test, all of the scan F/Fs operate simultaneously, and the circuit is brought into a highly activated state because the internal state thereof changes frequently. Therefore, power consumption may become a problem (see, for example, P. Girad, "Survey of Low-Power Testing of VLSI Circuits," IEEE Design & Test of Computers, Vol. 19, No. 3, pp. 82-92, 2002). In general, clock gating design is applied in an LSI modified for low power consumption, power consumption is restrained by stopping a clock supply to an F/F that is not in operation (whose output value does not change).

Power consumption in question can be broadly divided into two categories of instantaneous power (peak power) that is consumed instantaneously and average power that is consumed on average for a certain fixed period. In a scan shift in which all scan F/Fs operate at the same time, an average power can be restrained by creating a test pattern with a small number of toggles as far as possible. However, since all the scan F/Fs operate simultaneously, this is an insufficient countermeasure in restraining instantaneous power. By dividing up the scan chain by clock domain and executing the scan shift with delays in the clock, it is possible to perform a normal scan shift without faulty input or misreading of data while reducing instantaneous power. However, in the case that there exists a main clock domain extending over the entire LSI, there is a problem that, because the majority of F/Fs within that domain operate simultaneously, the effect of reducing power consumption is small. It is possible to divide a main clock domain into a plurality of clock domains at the time of test only, and apply a plurality of external clocks, but there is a problem that this increases the burden of clock design.

SUMMARY OF THE INVENTION

An aspect of the present invention provides a semiconductor integrated circuit that includes a combinational logic circuit; a scan chain circuit comprising a plurality of flip-flops that are serially connected, and configured to temporarily store data that is inputted to and outputted from the combinational logic circuit during ordinary operation, and to cause the plurality of flip-flops to function as shift registers to execute a scan shift that serially transfers test pattern data for a scan test during execution of a scan test; and a clock gating circuit configured to control output of a pulse of a clock signal supplied to the scan chain circuit in accordance with a clock gating signal, whereas disable the clock gating signal based on a logic of a scan enable signal authorizing the scan shift, the clock gating circuit including a first clock gating circuit configured to disable the clock gating signal during the scan shift based on the logic of the scan enable signal and also to invert the clock signal to output a resulting inverted signal.

In addition, an aspect of the present invention provides a design automation system that automates a design of a semiconductor integrated circuit, the semiconductor integrated circuit including at least: a combinational logic circuit; a scan chain circuit comprising a plurality of flip-flops that are serially connected, and configured to temporarily store data that is inputted to and outputted from the combinational logic circuit during ordinary operation, and to cause the plurality of flip-flops to function as shift registers to execute a scan shift that serially transfers test pattern data for a scan test during execution of a scan test; and a clock gating circuit configured to control output of a pulse of a clock signal supplied to the scan chain circuit in accordance with a clock gating signal while at the same time to disable the clock gating signal based on a logic of a scan enable signal authorizing the scan shift, the design automation system being configured to enable a computer to perform:

selecting at least one of a plurality of the clock gating circuits included in the semiconductor integrated circuit; substituting the selected clock gating circuit for an inverting-function clock gating circuit having a function that inverts the clock signal; and outputting a netlist after the substitution, when a number of the flip-flops in one clock domain that are controlled by the inverting-function clock gating circuit reaches a predetermined number.

Furthermore, another aspect of the present invention provides a semiconductor integrated circuit, comprising: a combinational logic circuit; a scan chain circuit comprising a plurality of flip-flops that are serially connected, and configured to temporarily store data that is inputted to and outputted from the combinational logic circuit during ordinary operation, and to cause the plurality of flip-flops to function as shift registers to execute a scan shift that serially transfers test pattern data for a scan test during execution of a scan test; and a clock gating circuit configured to control output of a pulse of a clock signal supplied to the scan chain circuit in accordance with a clock gating signal, whereas disable the clock gating signal based on a logic of a scan enable signal authorizing the scan shift, a portion of the flip-flops comprising: a master latch that loads data while the clock signal rises; and a slave latch that loads data while the clock signal falls, wherein while the scan enable signal is disabled, the portion of the flip-flops operate as flip-flops activated by a rising edge of the clock signal to load data at the master latch, then transfer the data to the slave latch, whereas while the scan enable signal is enabled, the portion of the flop-flops operate as flip-flops activated by a falling edge of the clock signal to load the test pattern data at the slave latch, then transfer the test pattern data to the master latch.

DETAILED DESCRIPTION OF THE EMBODIMENTS

Embodiments of the present invention are described below with reference to the drawings.

First Embodiment

A semiconductor integrated circuit according to a first embodiment of the present invention is described with reference to the drawings.

Figure 1:
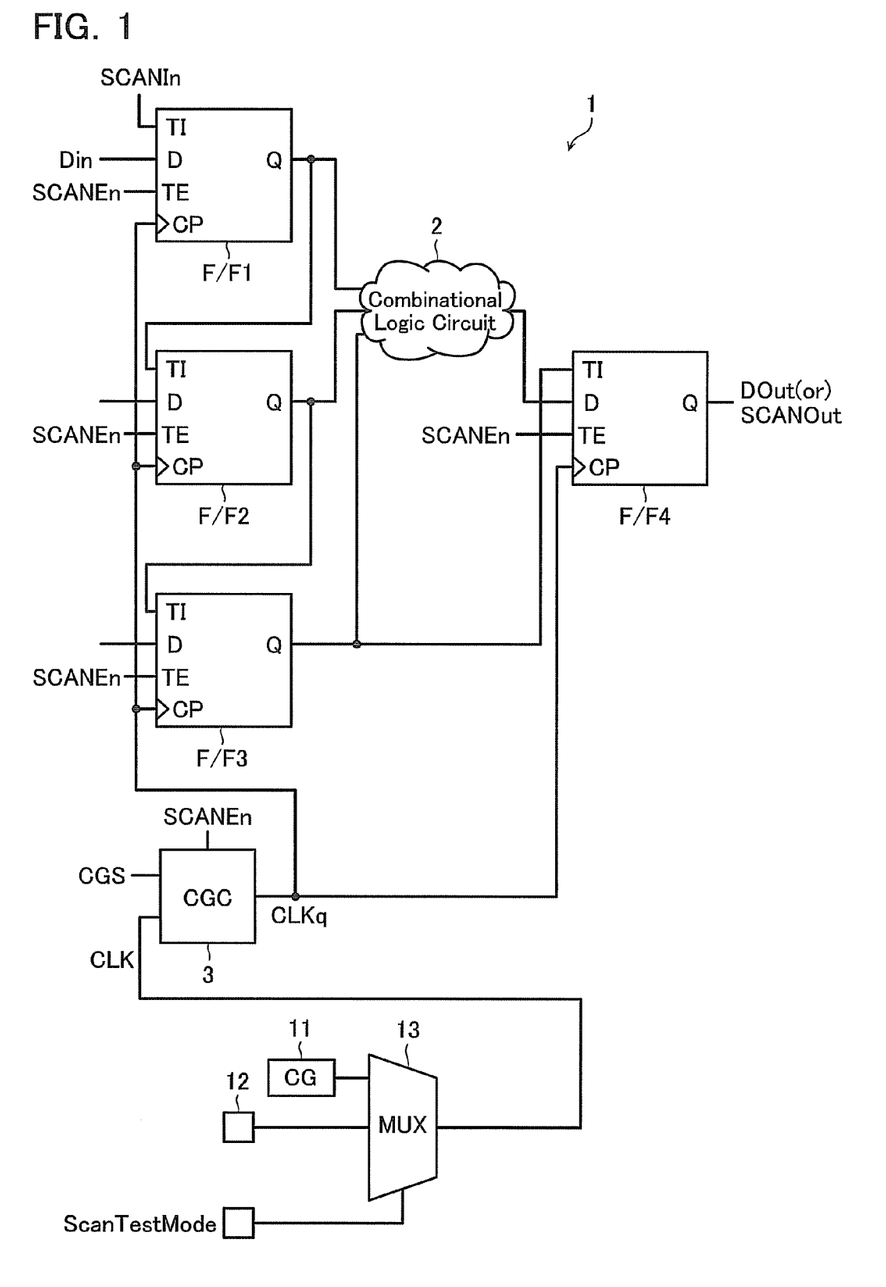
FIG. 1 shows an example of a configuration of a general scan chain circuit and combinational logic circuit.

Prior to description of the first embodiment, an example of a configuration of a general scan chain circuit and combinational logic circuit is explained with reference to FIG. 1. A combinational logic circuit 2 has scantest flip-flops F/F1 to F/F3 disposed on an input terminal side thereof and scantest flip-flop F/F4 disposed on an output terminal side thereof. In addition, these four flip-flops F/F1 to F/F4 are connected in series to constitute a scan chain circuit 1 functioning as a shift register during a scan test.

That is to say, in ordinary operation, these flip-flops F/F1 to F/F3 temporarily store input data Din inputted to them through data input terminals D, and output output data to the combinational logic circuit 2 through data output terminals Q. In addition, flip-flop F/F4 temporarily stores data outputted from the combinational logic circuit 2 and inputted to it through data input terminal D, and outputs output data Dout through data output terminal Q.

On the other hand, in a scan shift operation, flip-flop F/F1 which is the most anterior stage of the serial connection receives a test pattern signal SCANIn generated by an ATPG (Automatic Test Pattern Generator) (not shown) at its test data input terminal TI. This test pattern signal SCANIn is sequentially transferred to and stored in flip-flops F/F2 to F/F4 that are serially connected to constitute a shift register, then a test result is loaded to each flip-flop by a clock signal. Thereafter, the loaded test result undergoes shift operation using the scan chain circuit 1 and is outputted as output signal SCANOut from output terminals, thereby executing a scan test.

The test pattern SCANIn is provided with a plurality of signals with different kinds, because the test must be performed for different places in the combinational logic circuit 2.

Places of malfunction in the combinational logic circuit 2 may be specified by checking the test output signal SCANOut obtained as a result of inputting a certain test pattern signal SCANIn. Note that a number of flip-flops F/F and a connectional relationship between the scan chain circuit 1 and the combinational logic circuit 2 are not limited to those shown in FIG. 1.

Clock terminals CP are provided with a clock signal CLKq via a clock gating circuit 3. The clock gating circuit 3 outputs clock signal CLKq obtained by gating control of a clock signal CLK. The clock gating circuit 3 is provided with a scan enable signal SCANEn that is set to "L" during ordinary operation and "H" during scan shift. The clock gating circuit 3 changes the clock signal CLKq in accordance with this scan enable signal SCANEn.

That is to say, during ordinary operation, the clock gating circuit 3 outputs a clock signal CLKq as a gated-clock signal obtained by thinning the clock signal CLK, on the basis of clock gating signal CGS. On the other hand, during scan shift operation, the clock gating circuit 3 outputs a clock signal CLKq as the clock signal CLK without thinning, regardless of the clock gating signal CGS.

The scan enable signal SCANEn is inputted also to scan enable terminals TE of each of the flip-flops F/F1 to F/F4. When scan enable signal SCANEn in each of the flip-flops F/F1 to F/F4 is set to "H", input of test pattern SCANIn from test data input terminals TI is authorized and shift register operation is effected. In contrast, when scan enable signal SCANEn is set to "L", ordinary data Din is inputted from data input terminals D.

Note that the clock signal supplied to clock gating circuit 3 is supplied via a clock generating circuit 11 or an external terminal 12, and a multiplexer 13. The multiplexer 13 operates in accordance with a scan test mode signal SCANTestMode to load a clock signal from the clock signal generating circuit 11 during ordinary operation and a clock signal for a scan test from the external terminal 12 during a scan test.

Figure 2:
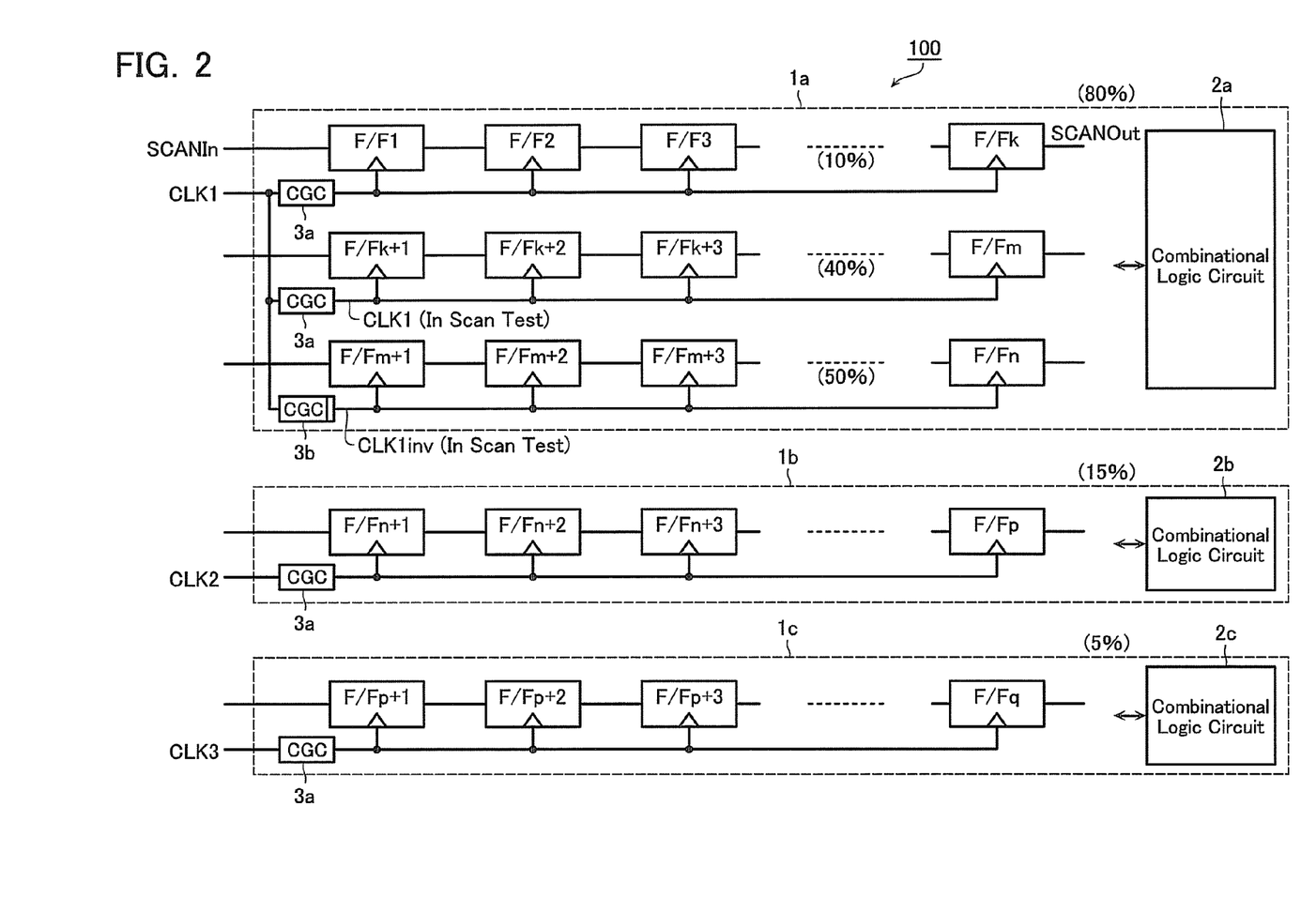
FIG. 2 is a block diagram showing an overall configuration of a semiconductor integrated circuit 100 in accordance with a first embodiment of the present invention.

FIG. 2 is a block diagram showing an overall configuration of a semiconductor integrated circuit 100 in accordance with a first embodiment of the present invention. The semiconductor integrated circuit 100 is controlled by clocks CLK1 to CLK3 of a plurality of different kinds (here, three kinds). Clock CLK1 is used in control of a main clock domain 2a (a combinational logic circuit) within the semiconductor integrated circuit 100, clock CLK2 is used in control of another clock domain 2b within the semiconductor integrated circuit 100, and clock CLK3 is used in control of yet another clock domain 2c within the semiconductor integrated circuit 100. Actual semiconductor integrated circuits are in most cases subdivided into an even greater number of clock domains, but here, for convenience of explanation, the semiconductor integrated circuit 100 with the above-mentioned three clock domains 2a to 2c is described.

The clock domains 2a to 2c are respectively prepared with scan chain circuits 1a to 1c for a scan test. The scan chain circuit 1a is provided with a total of n flip-flops F/F1 to F/Fn, the scan chain circuit 1b is provided with a total of (p-n) flip-flops F/Fn+1 to F/Fp, and the scan chain circuit 1c is provided with a total of (q-p) flip-flops F/Fp+1 to F/Fq.

Here, attention is focused on the clock domain 2a. The clock domain 2a is the main clock domain within the semiconductor integrated circuit 100. Therefore, simultaneous operation of all the (n) flip-flops F/F1 to F/Fn included in the scan chain circuit 1a leads to a rise in instantaneous power.

Accordingly, in the present embodiment, as for about half of the total n flip-flops F/F1 to F/Fn, namely m flip-flops F/F1 to F/Fm, a scan shift is executed using an identical clock signal CLK1, while as for the remaining (n-m) flip-flops F/Fm+1 to F/Fn, a scan shift is executed using a clock signal CLK1inv which is clock signal CLK1 inverted. The clock signal CLK1inv is the inverted clock signal of the clock signal CLK1. Therefore, the flip-flops F/Fm+1 to F/Fn do not operate simultaneously with the remaining flip-flops F/F1 to F/Fm. As a result, it becomes possible to reduce the instantaneous power when executing a scan shift of the semiconductor integrated circuit 100. As described later, in a design automation system that automatically designs, for example, a semiconductor integrated circuit 100 of the kind shown in FIG. 2, one of the plurality of clock gating circuits included within one clock domain is selected, and this selected clock gating circuit is provided with a clock signal inverting function. And, if the number of flip-flops controlled by the clock gating circuit that is selected and provided with the inverting function has reached half of the total number of flip-flops included within the relevant clock domain, a netlist at that time is outputted. If it has not reached half, a new clock gating circuit is selected. A similar procedure can be effected also with the other scan chain circuits 1b and 1c, although an explanation thereof is omitted.

Figure 3:
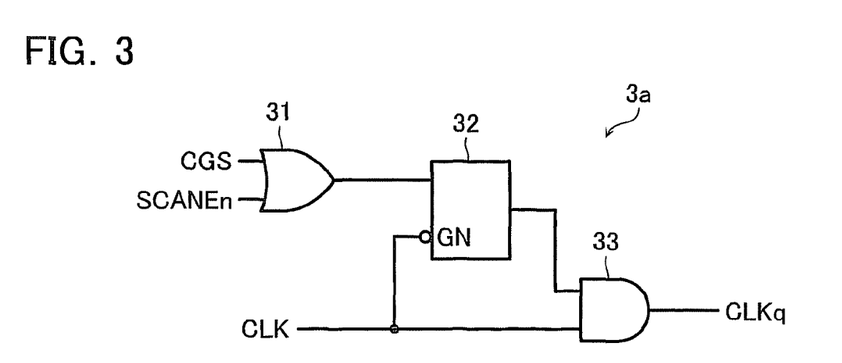
FIG. 3 shows an example of a configuration of an ordinary clock gating circuit 3a (without inverting function) shown in FIG. 2.

That is to say, the scan chain circuit 1a which is provided corresponding to clock domain 2a that configures a single clock domain includes n flip-flop circuits F/F1 to F/Fn. In addition, approximately half of those flip-flops, namely the (n-m) flip-flops F/Fm+1 to F/Fn, are controlled by the inverting function-equipped clock gating circuit 3b which inverts the clock signal CLK1 and outputs this as inverted clock signal CLK1inv. The rest of the flip-flops F/F1 to F/Fm have the ordinary clock gating circuit 3a, and use the clock signal CLK1 as it is without inverting even during scan test, FIG. 3 shows an example of a configuration of an ordinary clock gating circuit 3a (without inverting function). This clock gating circuit 3a is provided with an OR gate 31, an inverting latch circuit 32, and an AND gate 33. The OR gate 31 is supplied with a clock gating signal CGS and a scan enable signal SCANEn to its input terminals. The inverting latch circuit 32 latches the output signal of the OR gate 31 when the clock signal CLK has fallen. The AND gate 33 outputs a logical conjunction (logical AND) signal of the clock signal CLK and an output signal of the inverting latch circuit 32.

Figure 4:
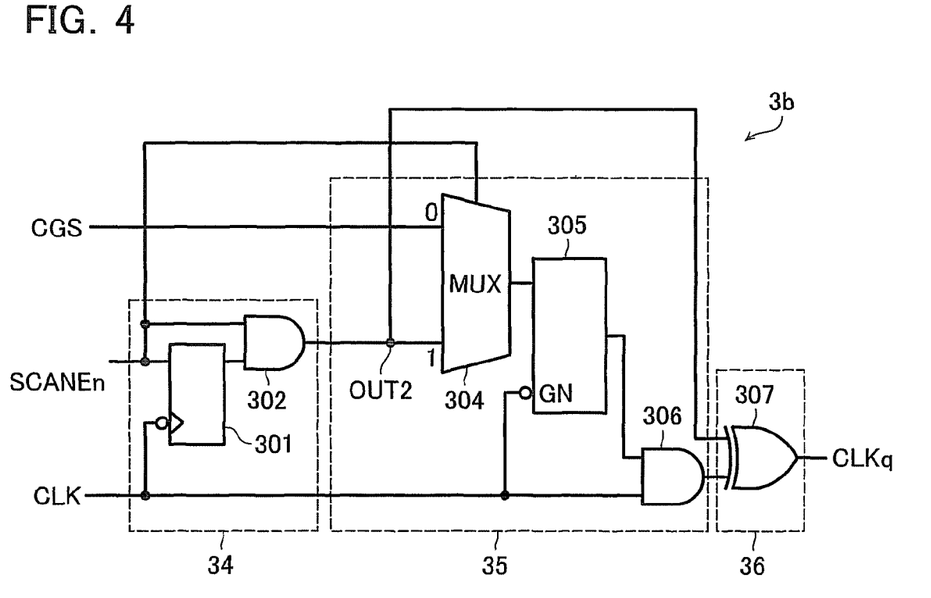
FIG. 4 shows an example of a configuration of an inverting function-equipped clock gating circuit 3b.

FIG. 4 shows an example of a configuration of the inverting function-equipped clock gating circuit 3b. This clock gating circuit 3b is provided with an edge detection circuit 34, a gating circuit 35, and an inverting circuit 36.

The edge detection circuit 34 detects a rise of the scan enable signal SCANEn and outputs an output signal OUT2 that rises for the period from the fall of the clock signal CLK immediately after the rise of the scan enable signal SCANEn (enabled) until the falling of the scan enable signal SCANEn (disabled). Specifically, the edge detection circuit 34 is provided with an inverting edge trigger-type flip-flop circuit 301 and an AND gate 302. The inverting edge trigger-type flip-flop circuit 301 latches the scan enable signal SCANEn when the clock signal CLK has fallen. The AND gate 302 outputs a logical conjunction (logical AND) signal of the latched data of the inverting edge trigger-type flip-flop circuit 301 and the scan enable signal SCANEn.

Furthermore, the gating circuit 35 is configured to control output of a pulse of the clock signal CLK in accordance with the clock gating signal CGS, while also to load the output signal OUT2 in place of the clock gating signal CGS while the scan enable signal SCANEn is raised. Specifically, the gating circuit 35 has a multiplexer 304, an inverting latch circuit 305, and an AND gate 306.

The multiplexer 304 selectively loads the clock gating signal CGS if the scan enable signal SCANEn is "L"; conversely it selectively loads the output signal of the AND gate 302 if the scan enable signal SCANEn is "H".

The inverting latch circuit 305 loads the output signal of the multiplexer 304 while the clock signal CLK is fallen or lowered. The AND gate 306 outputs a logical conjunction (logical AND) signal of the latched data of the inverting latch circuit 305 and the clock signal CLK.

The inverting circuit 36 is configured by an exclusive logical disjunction (exclusive logical OR) circuit 307 and inverts the clock signal CLK during execution of scan shift. The exclusive logical disjunction circuit 307 outputs an exclusive logical disjunction signal of the output signal of the AND gate 302 and the output signal of the AND gate 306.

Next, operation of the ordinary clock gating circuit 3a (without inverting function) is explained with reference to a timing chart of FIG. 5. This clock gating circuit 3a has an OR gate 31 inputted with a scan enable signal SCANEn and a clock gating signal CGS. Consequently, during ordinary operation when the scan enable signal SCANEn is set to "L", the clock gating signal CGS becomes active, and the clock gating circuit 3a is influenced only by the clock gating signal CGS. Thus, a clock signal CLKq is outputted as a gated clock signal obtained by thinning the clock signal.

On the other hand, when the scan enable signal SCANEn is set to "H" for execution of scan shift, the clock gating signal CGS is nullified, deactivated or disabled by the OR gate 31. Consequently, the AND gate 33 outputs a clock signal CLKq synchronized with a rise of the clock signal CLK.

Next, operation of the inverting function-equipped clock gating circuit 3b is explained with reference to a timing chart of FIG. 6. When the scan enable signal SCANEn is set to "L" for ordinary operation, the output signal of the edge detection circuit 34 in the clock gating circuit 3b is fixed at "L". In addition, both the multiplexer 304 is set to a state where the clock gating signal CGS is selectively loaded. In addition, the inverting circuit 36 has one of input signals thereto fixed at "L". Therefore, the inverting circuit 36 simply functions as a buffer. Consequently, when the scan enable signal SCANEn is set to "L", that is in ordinary operation, the clock gating circuit 3b operates in an entirely identical manner to the clock gating circuit 3a. In other words, the clock gating circuit 3b is influenced only by the clock gating signal CGS and outputs a clock signal CLKq as a gated clock signal obtained by thinning the clock signal CLK.

On the other hand, when the scan enable signal SCANEn is set to "H" for execution of scan shift, the multiplexer 304 achieves a state where the output signal of the AND gate 302 is selectively loaded. Furthermore, the output signal OUT2 of the edge detection circuit 34 becomes "H" between time t21 and time t5. Consequently, between time t21 and time t5, the signal outputted by the inverting circuit 36, namely the exclusive logical disjunction (exclusive logical OR) signal of the clock signal CLK and the output signal OUT2, becomes an inverted signal of the clock signal CLK.

Figure 5:
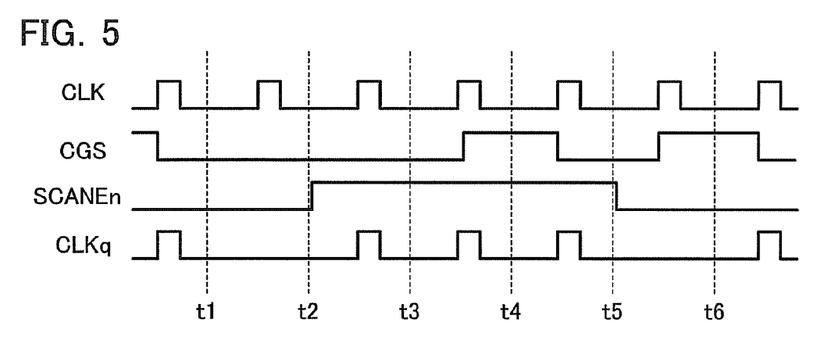
FIG. 5 is a timing chart showing operation of the ordinary clock gating circuit 3a (without inverting function).
Figure 6:
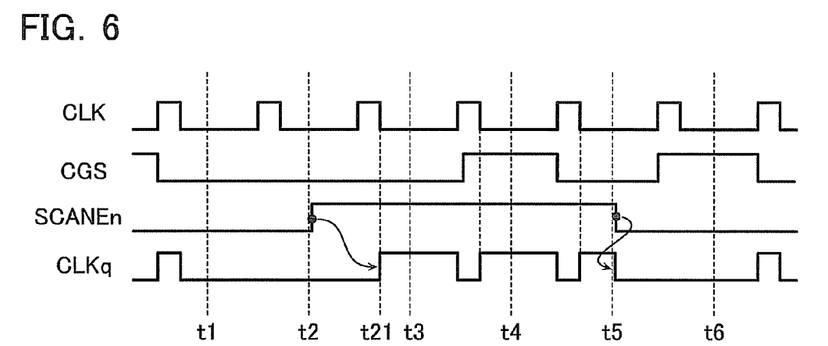
FIG. 6 is a timing chart explaining operation of the inverting function-equipped clock gating circuit 3b.

In this way, the clock gating circuit 3a and the clock gating circuit 3b are driven by clock signals of different phase during execution of scan shift, even though they are provided with the same clock signal CLK (refer to CLKq of FIGS. 5 and 6). Consequently, by implementing a circuit design in which, within one clock domain, a number of flip-flops F/F controlled by clock gating circuit 3a and a number of flip-flops F/F controlled by clock gating circuit 3b is set to be approximately the same, it becomes possible to reduce instantaneous power during a scan shift.

Second Embodiment

Next, a design automation system according to a second embodiment of the present invention is described with reference to the drawings.

Figure 7:
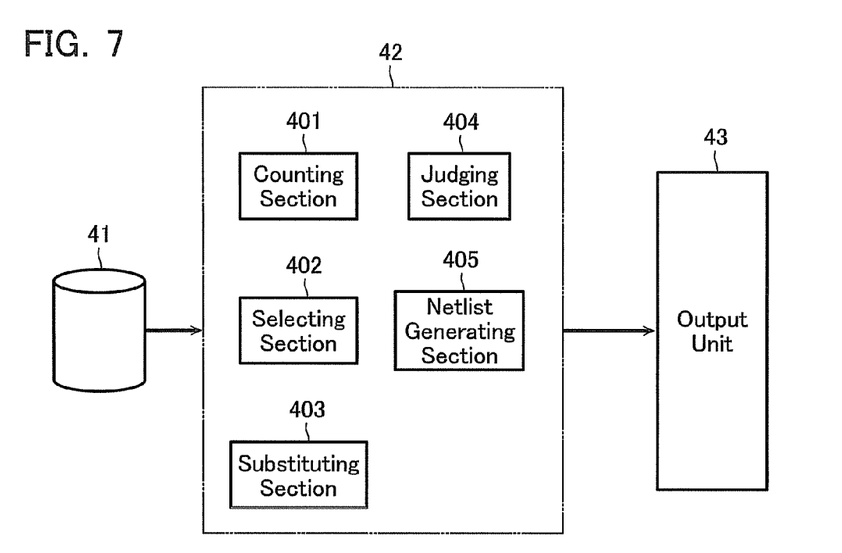
FIG. 7 is a block diagram showing a design automation system in accordance with a second embodiment of the present invention.

FIG. 7 is a block diagram showing a configuration of a design automation system in accordance with a second embodiment of the present invention. This design automation system is realizable through a computer and a computer program, and in one example is provided with a netlist storage unit 41 that stores a netlist of the semiconductor integrated circuit to be designed, a circuit design unit 42, and an output unit 43.

Here, a netlist stored in the netlist storage unit 41 is to include combinational logic circuits, flip-flops, and clock gating circuits.

The circuit design unit 42 is provided with a counting section 401, a selecting section 402, a substituting section 403, a judging section 404, and a netlist generating section 405. 401 to 405 are realizable also by way of the computer program that is stored in and executed by the computer.

The counting section 401 has a function of counting a number of flip-flops included within one clock domain. The selecting section 402 has a function of selecting an arbitrary one from among the clock gating circuits included within the one clock domain. The substituting section 403 has a function of substituting the clock gating circuit selected by the selecting section 402 with an inverting function-equipped clock gating circuit. The judging section 404 has a function of determining whether or not the number of flip-flops controlled by the inverting function-equipped clock gating circuit exceeds half of the total number of flip-flops included in the one clock domain, in accordance with a count value in the counting section 401, the netlist, and a substitution result in the substituting section 403. The netlist generating section 405 has a function of generating a netlist on completion of operations of the counting section 401, the selecting section 402, the substituting section 403, and the judging section 404. The output unit 43 outputs to the exterior the netlist generated hereby.

Figure 8:
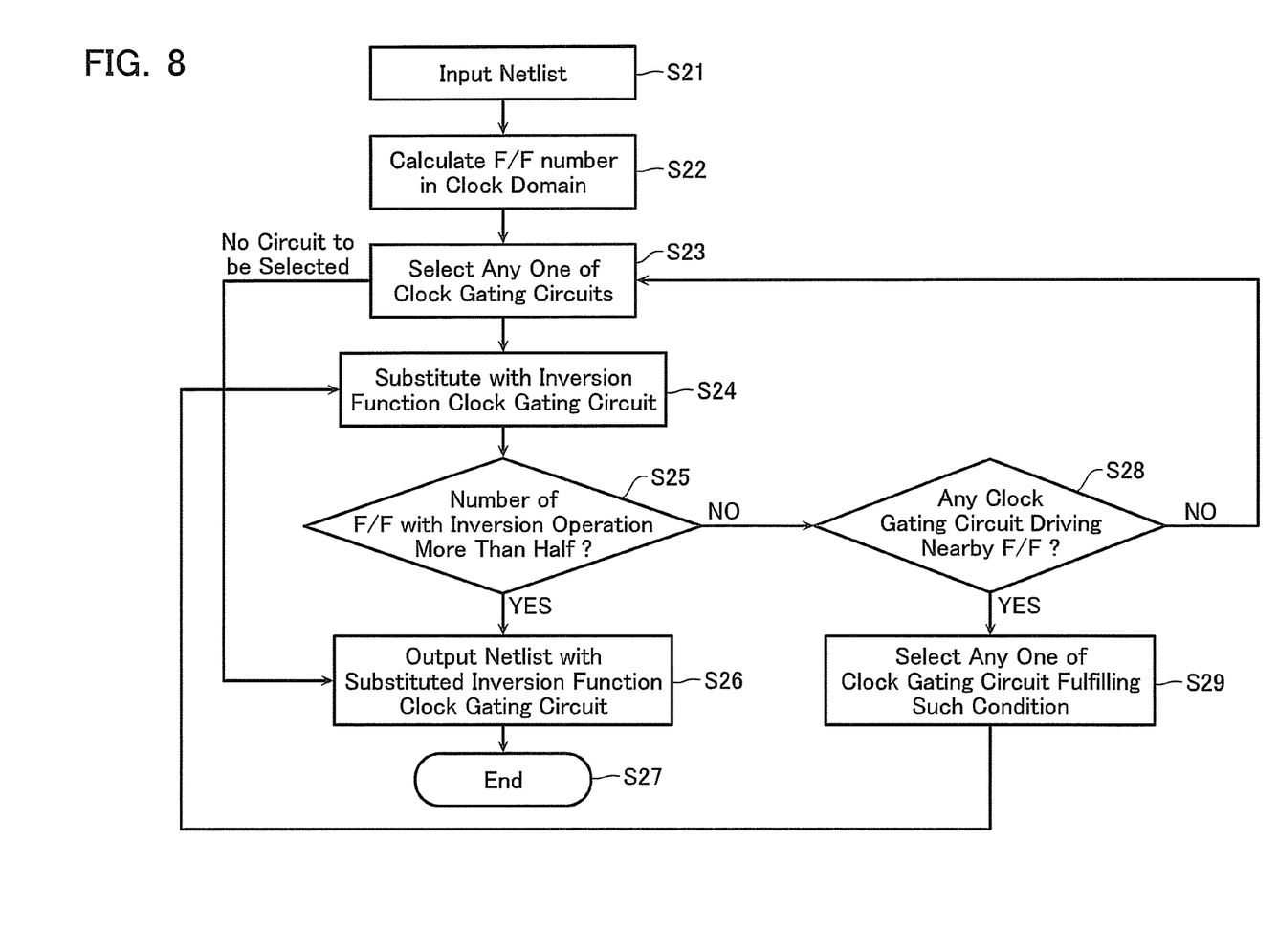
FIG. 8 is a flow chart describing steps in design of a semiconductor integrated circuit using the system shown in FIG. 7.

Next, steps for design of a semiconductor integrated circuit using the system shown in FIG. 7 are described with reference to the flowchart shown in FIG. 8.

First, a netlist of a semiconductor integrated circuit to be designed is input from the netlist storage unit 41 to the circuit design unit 42 (S21).

Next, a number of flip-flops included within one clock domain within this netlist is calculated using the counting section 401 (S22). Then, one arbitrary clock gating circuit is selected from among the plurality of clock gating circuits disposed within the one clock domain (S23), and the selected clock gating circuit is substituted with an inversion function-equipped clock gating circuit (S24). Note that the selection in the step S23 may be effected by an operator via an input section (not shown) or may be automatically executed by the selecting section 402.

Thereafter, the judging section 404 determines whether or not the number of flip-flops controlled by the inverting function-equipped clock gating circuit exceeds half of the total number of flip-flops included in the one clock domain, in accordance with a count value calculated in S22, the netlist, and a substitution result of S24 (S25). If the number exceeds half of the total (YES), a netlist including the inverting function-equipped clock gating circuit deployed through the substituting operation of S24 is outputted from the output unit 43 and the processing is completed (S26 and S27).

On the other hand, if it is determined that the number does not exceed half of the total in S25 (NO), it is determined whether or not there exist other clock gating circuits driving nearby flip-flops (S28). If such other clock gating circuits exist (YES), one of those clock gating circuits fulfilling such conditions is selected (S29). Then, the process returns to the step S24 to repeat the substituting operation.

On the other hand, if it is determined that no clock gating circuits fulfilling the conditions exist (NO), the process returns to the step S23 and an arbitrary clock gating circuit is selected (S23). Note that, in the case where it is judged in the step S23 that there is no selectable clock gating circuit, a jump is made to the step S26 and the processing is completed.

Figure 9:
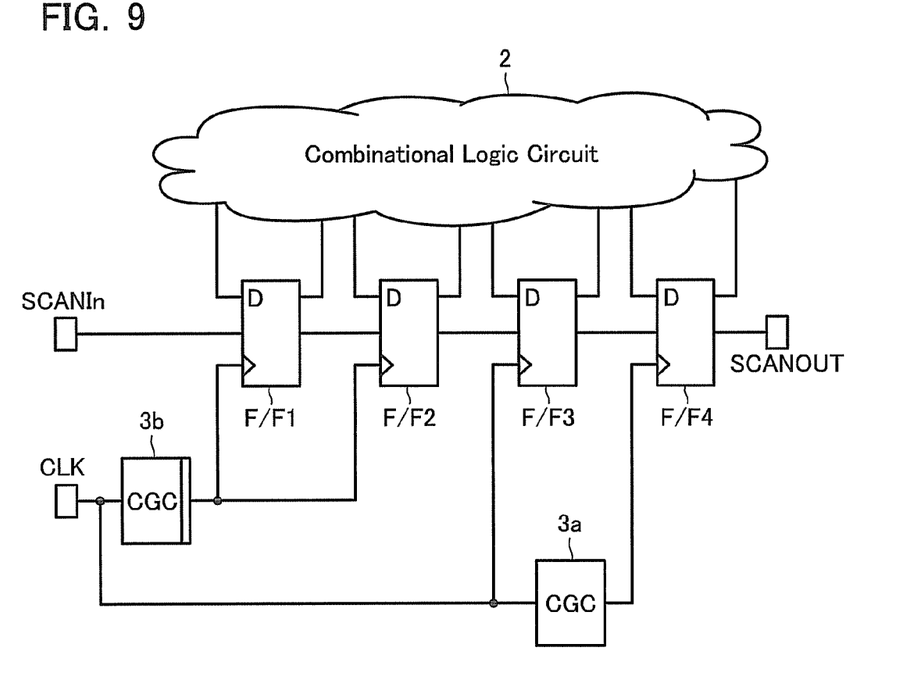
FIG. 9 is a schematic diagram describing an operation in the system shown in FIG. 7.

It is assumed here that, as shown in FIG. 9, a scan chain has both flip-flops F/F1 to F/F2 controlled by an inverting function-equipped clock gating circuit 3b, and flip-flops F/F3 to F/F4 controlled by a non-inverting function-equipped clock gating circuit 3a. In this case, if flip-flops F/F1 to F/F2 are in an anterior stage to flip-flops F/F3 to F/F4, it becomes possible to effect normal passing on of data (shift operation), even if flip-flops F/F1 to F/F4 configures a single scan chain circuit.

Based on this standpoint, in the step S28 of the present embodiment, it is determined whether or not there exist other clock gating circuits driving nearby flip-flops. If such a clock gating circuit exists, that clock gating circuit is also substituted with an inverting function-equipped clock gating circuit. In this way, by selecting and substituting flip-flops nearby to flip-flops controlled by an inverting function-equipped clock gating circuit and gathering such flip-flop circuits at the head of the scan chain circuit, it is possible to shorten the length of wiring in the scan chain circuit.

Third Embodiment

Next, a design automation system according to a third embodiment of the present invention is described with reference to the drawings.

Figure 10:
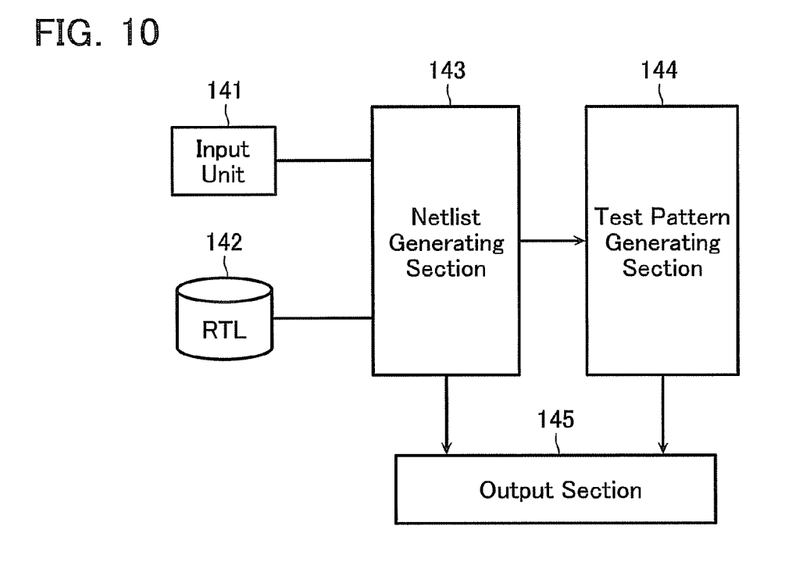
FIG. 10 is a block diagram showing a configuration of a design automation system in accordance with a third embodiment of the present invention.

FIG. 10 is a block diagram showing a configuration of a design automation system in accordance with a third embodiment of the present invention. This design automation system is realizable through a computer and a computer program, and in one example is configured so as to enable automatic design of a semiconductor integrated circuit such as that shown in FIG. 2. The system is configured from an input unit 141, a data storage section 142, a netlist generating section 143, a test pattern generating section 144, and an output section 145. The sections 143 to 144 are realizable also by way of the computer program that is stored in and executed by the computer.

The input unit 141 is provided to input a selection for inverted clocking described below and other instructions from an operator necessary for the design. The data storage section 142 stores an RTL (Register Transfer Level) of a circuit to be designed.

In addition, the netlist generating section 143 generates a netlist of the circuit to be designed based on input data from the input unit 141 and the RTL. Also, the test pattern generating section 144 generates a test pattern to test the circuit to be designed based on ATPG (not shown) and the above-mentioned netlist. The output section 145 outputs the generated netlist and test pattern.

Figure 11:
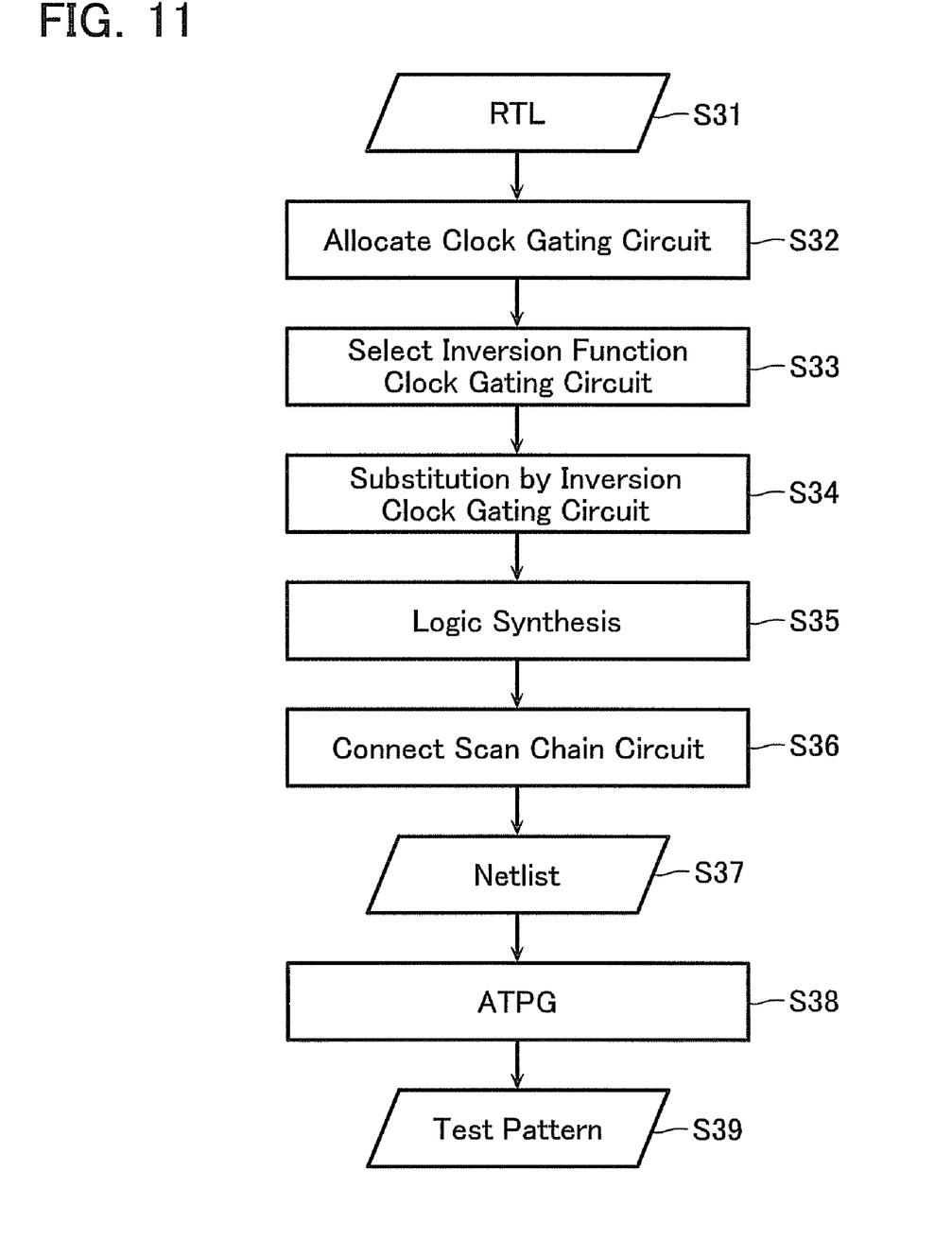
FIG. 11 is a flow chart describing steps in design of a semiconductor integrated circuit using the system shown in FIG. 10.

Next, steps for design of a semiconductor integrated circuit using the system shown in FIG. 10 are described with reference to the flowchart shown in FIG. 11. Here, design is implemented so that half of the clock gating circuits within a certain clock domain in the semiconductor integrated circuit become the inverting function-equipped clock gating circuits described in the first embodiment.

First, the RTL of the circuit to be designed is inputted from the data storage section 142 to the netlist generating section 143 (S31).

Next, a process of allocating a clock gating circuit to each clock domain (clock-gating allocation)is executed (S32). Then, a clock gating circuit that is to be made into an inverting function-equipped clock gating circuit is selected from among the plurality of clock gating circuits allocated in the above-described way (S33). The selected clock gating circuit is substituted with an inverting function-equipped one (S34). Note that this selection may be effected by an operator via the input unit 141 or may be automatically executed by the netlist generating section 143.

Next, logic synthesis of the RTL is effected (S35) and connection of the scan chain circuit is implemented (S36) in accordance with this substitution result. At this time, scan chain connection is implemented so that flip-flops controlled by inverting function-equipped clock gating circuits are gathered in an anterior stage portion of the scan chain circuit and flip-flops controlled by non-inverting function-equipped (inverting function-less) clock gating circuits are gathered in a latter stage. The netlist generated hereby is outputted from the output section 145 (S37). In addition, the test pattern is generated and outputted using ATPG (S38 and S39).

Fourth Embodiment

Next, a fourth embodiment of the present invention is described with reference to FIGS. 12 and 13. The above-described first through third embodiments of the figures aim to reduce instantaneous power by substituting clock gating circuits with inverting function-equipped ones. In contrast, the present embodiment does not implement substitution of clock gating circuits with inverting function-equipped ones. Instead, it has a configuration that enables a portion of the flip-flops comprising the scan chain circuit to be changed from a circuit that latches data with a rising clock signal to a circuit that latches data with a falling clock signal (or vice-versa), during execution of a scan shift.

Figure 12:
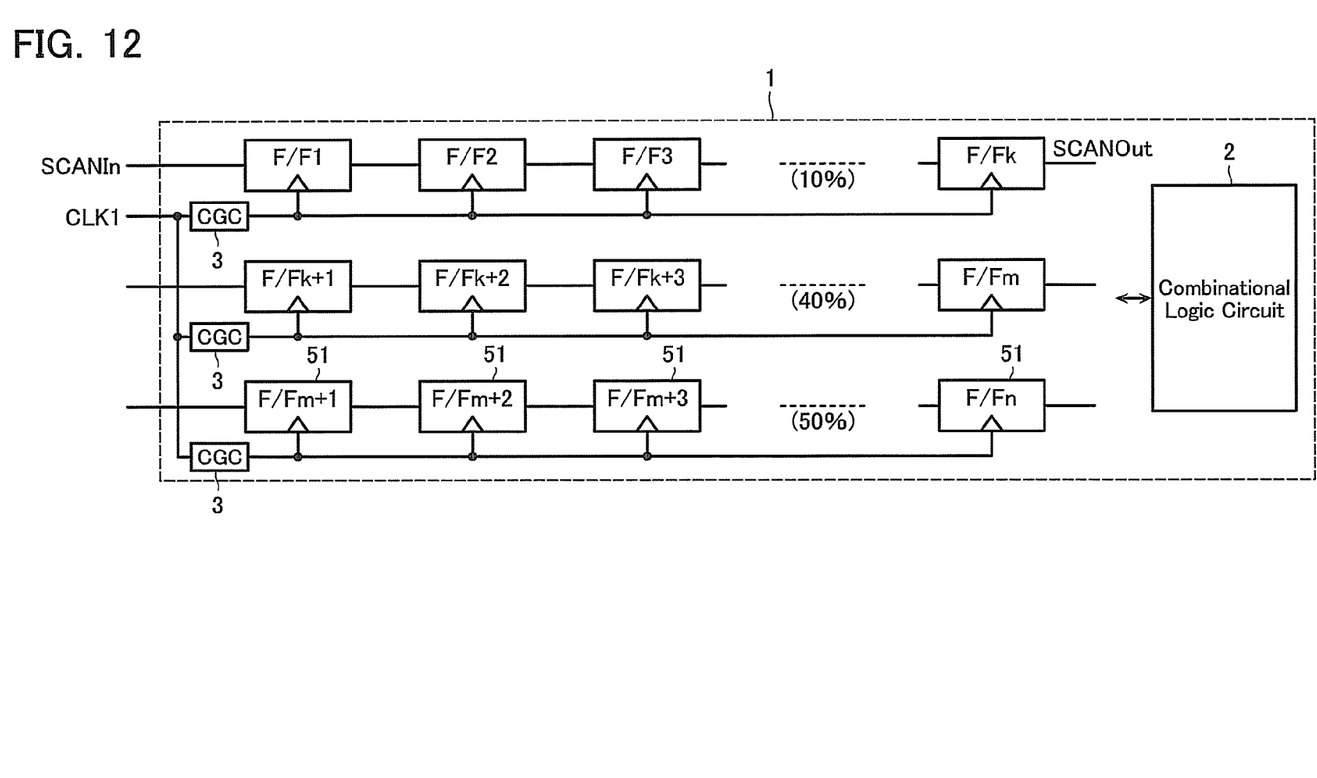
FIG. 12 is a block diagram showing a part of a configuration of a semiconductor integrated circuit in accordance with the present embodiment.

FIG. 12 is a block diagram showing a part of a configuration of a semiconductor integrated circuit in accordance with the present embodiment. As shown in FIG. 12, in the semiconductor integrated circuit of the present embodiment, the combinational logic circuit 2 forms one clock domain. The scan chain circuit 1 is provided corresponding to the combinational logic circuit 2. The clock gating circuits 3 are included within the scan chain circuit 1, each operated by the same clock signal CLK. No inverting function is provided to the clock gating circuits 3.

Instead, half of the n flip-flops F/F included within the scan chain circuit 1, namely flip-flops F/Fm+1 to F/Fn, are set as flip-flops 51. A flip-flop 51 is capable of changing from a circuit that latches data with a rising clock signal to a circuit that latches data with a falling clock signal (or vice-versa), during execution of a scan test. This makes it possible to achieve the same effect as in the first through third embodiments without substituting the clock gating circuits with inverting function-equipped ones.

Figure 13:
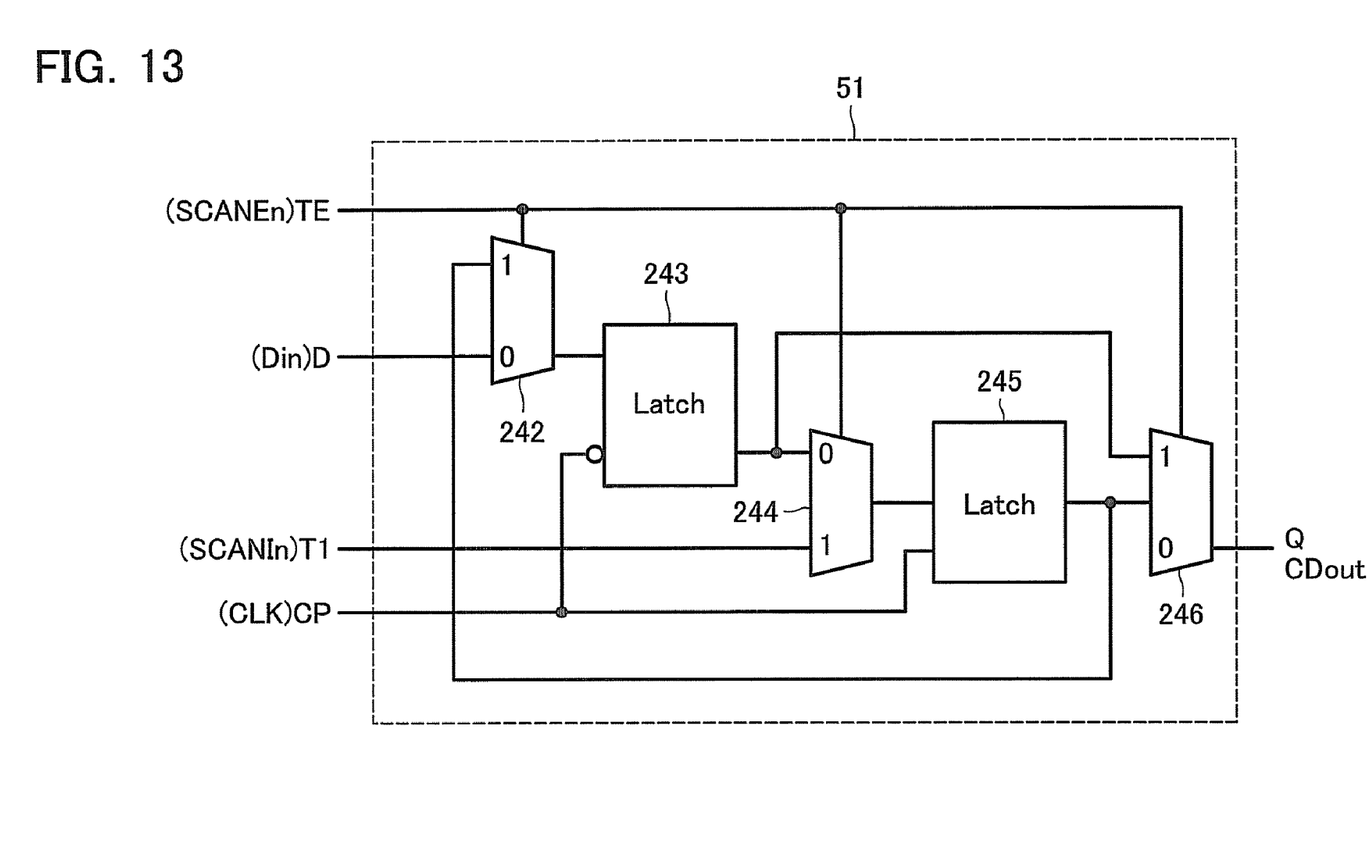
FIG. 13 shows an example of a configuration of a flip-flop 51 described in FIG. 12.

FIG. 13 shows an example of a configuration of a flip-flop 51 described in FIG. 12. This flip-flop 51 is provided with multiplexers 242, 244, and 246, a first latch circuit 243 (a master latch), and a second latch circuit 245 (a slave latch).

The multiplexer 242 is configured to selectively load ordinary data Din when scan enable signal SCANEn is "L" (disabled), and an output signal of the second latch circuit 245 when the scan enable signal SCANEn is "H". The first latch circuit 243 loads an output signal of the multiplexer 242 while the clock signal CLK is lowered. The multiplexer 244 is configured to selectively load an output signal of the first latch circuit 243 when scan enable signal SCANEn is "L" (disabled), and a test pattern SCANIn when scan enable signal SCANEn is "H" (enabled). The second latch circuit 245 loads an output signal of multiplexer 244 while the clock signal CLK is raised. The multiplexer 246 is configured to selectively load an output signal of the second latch circuit when scan enable signal SCANEn is "L", and an output signal of the first latch circuit 243 when scan enable signal SCANEn is "H".

The embodiments of the invention have been described above though the present invention is not limited to these embodiments but rather can be given various modifications and additions without departing from the scope and spirit of the invention.

What is claimed is:
1. A semiconductor integrated circuit, comprising:
a combinational logic circuit;
a scan chain circuit comprising a plurality of flip-flops that are serially connected, and configured to temporarily store data that is inputted to and outputted from the combinational logic circuit during ordinary operation, and to cause the plurality of flip-flops to function as shift registers to execute a scan shift that serially transfers test pattern data for a scan test during execution of the scan test; and
a clock gating circuit configured to control output of a pulse of a clock signal supplied to the scan chain circuit in accordance with a clock gating signal, whereas the clock gating signal being disabled based on a scan enable signal authorizing the scan shift,
the clock gating circuit including a first clock gating circuit configured to disable the clock gating signal during the scan shift based on the scan enable signal and also to invert the clock signal to output an inverted gated-clock signal and a second clock gating circuit configured to disable the clock gating signal during the scan shift based on the scan enable signal and output a gated-clock signal without inverting, wherein the scan chain circuit is configured to operate such that part of the serially connected flip-flops execute the scan shift in accordance with the gated-clock signal and other part of the serially connected flip-flops execute the scan shift in accordance with the inverted gated-clock signal.

2. The semiconductor integrated circuit according to claim 1, wherein the first clock gating circuit outputs the gated-clock signal obtained by thinning out the clock signal according to the clock gating signal during ordinary operation, whereas the first clock gating circuit outputs the inverted gated-clock signal without thinning out the clock signal by disabling the clock gating signal during the scan shift operation.

3. The semiconductor integrated circuit according to claim 1, wherein the scan chain circuit includes:

a first flip-flop controlled by the first clock gating circuit, and a second flip-flop controlled by the second clock gating circuit, the first flip-flop being disposed in an anterior stage compared to the second flip-flop.

4. The semiconductor integrated circuit according to claim 1, wherein the second clock gating circuit outputs the gated-clock signal obtained by thinning out the clock signal according to the clock gating signal during ordinary operation, whereas the second clock gating circuit outputs the gated-clock signal without thinning out the clock signal by disabling the clock gating signal during the scan shift operation.

5. The semiconductor integrated circuit according to claim 1, wherein the first clock gating circuit comprises:

an edge detection circuit detecting a change in logic level of the scan enable signal and outputting a first output signal that rises between a falling edge of the clock signal immediately after enablement of the scan enable signal and a disablement of the scan enable signal;

a gating circuit controlling output of a pulse of the clock signal in accordance with the clock gating signal, whereas loading the first output signal in place of the clock gating signal while the scan enable signal is enabled; and an inverting circuit that inverts the clock signal in accordance with the first output signal.

6. The semiconductor integrated circuit according to claim 5, wherein the inverting circuit comprises an EX-OR gate outputting an exclusive disjunction signal of the first output signal and the clock signal; and wherein the gating circuit comprises:

a multiplexer selectively loading the first output signal or the clock gating signal and outputting a result of selective loading;

a latch circuit that allows an output signal of the multiplexer to pass through when the clock signal is in a first state and stores an output signal of the multiplexer when the clock signal is in a second state; and an AND gate outputting a logical conjunction signal of a latched data of the latch circuit and the clock signal.

7. The semiconductor integrated circuit according to claim 1, wherein:

the combinational logic circuit is divided into a plurality of clock domains operated by different clock signals, respectively;

the scan chain circuit is provided for each of the plurality of clock domains; and the scan chain circuit provided for one of the plurality of clock domains is controlled by a plurality of the clock gating circuit, the plurality of the clock gating circuit includes the first clock gating circuit and the second gating circuit.

8. The semiconductor integrated circuit according to claim 7, wherein the first clock gating circuit outputs the gated-clock signal obtained by thinning out the clock signal according to the clock gating signal during ordinary operation, whereas the first clock gating circuit outputs the inverted gated-clock signal without thinning out the clock signal by disabling the clock gating signal during the scan shift operation.

9. The semiconductor integrated circuit according to claim 7, wherein the second clock gating circuit outputs the gated-clock signal obtained by thinning out the clock signal according to the clock gating signal during ordinary operation, whereas the second clock gating circuit outputs the gated-clock signal without thinning the clock signal by disabling the clock gating signal during the scan shift operation.

10. The semiconductor integrated circuit according to claim 7, wherein the first clock gating circuit comprises:

an edge detection circuit detecting a change in logic level of the scan enable signal and outputting a first output signal that rises between a falling edge of the clock signal immediately after enablement of the scan enable signal and a disablement of the scan enable signal;

a gating circuit controlling output of a pulse of the clock signal in accordance with the clock gating signal, whereas loading the first output signal in place of the clock gating signal while the scan enable signal is enabled; and an inverting circuit that inverts the clock signal in accordance with the first output signal.

11. The semiconductor integrated circuit according to claim 10, wherein the inverting circuit comprises an EX-OR gate outputting an exclusive disjunction signal of the first output signal and the clock signal; and wherein the gating circuit comprises:

a multiplexer selectively loading the first output signal or the clock gating signal and outputting a result of selective loading;

a latch circuit that allows an output signal of the multiplexer to pass through when the clock signal is in a first state and stores an output signal of the multiplexer when the clock signal is in a second state; and an AND gate outputting a logical conjunction signal of a latched data of the latch circuit and the clock signal.

12. The semiconductor integrated circuit according to claim 1, further comprising a multiplexer selectively loading either a first clock signal for ordinary operation or a second clock signal for a scan test as the clock signal.

13. A design automation system that automates a design of a semiconductor integrated circuit, the semiconductor integrated circuit including at least:

a combinational logic circuit;

a scan chain circuit comprising a plurality of flip-flops that are serially connected, and configured to temporarily store data that is inputted to and outputted from the combinational logic circuit during ordinary operation, and to cause the plurality of flip-flops to function as shift registers to execute a scan shift that serially transfers test pattern data for a scan test during execution of the scan test; and a clock gating circuit configured to control output of a pulse of a clock signal to generate a gated-clock signal supplied to the scan chain circuit in accordance with a clock gating signal while at the same time to disable the clock gating signal based on a scan enable signal authorizing the scan shift, the design automation system being configured to enable a computer to perform:

selecting at least one of a plurality of the clock gating circuits included in the semiconductor integrated circuit;

substituting the selected clock gating circuit by an inverting-function clock gating circuit having a function that inverts the clock signal to output an inverted gated-clock signal to operate the scan chain circuit such that part of the serially connected flip-flops execute the scan shift in accordance with the gated-clock signal and other part of the serially connected flip-flops execute the scan shift in accordance with the inverted gated-clock signal; and outputting a netlist after the substitution, when a number of the flip-flops in one clock domain that are controlled by the inverting-function clock gating circuit reaches a predetermined number.

14. The design automation system according to claim 13, wherein when a number of the flop-flops controlled by the inverting-function clock gating circuit does not reach a predetermined number, another clock gating circuit is substituted for the inverting-function clock gating circuit.

15. A semiconductor integrated circuit, comprising:
a combinational logic circuit;
a scan chain circuit comprising a plurality of flip-flops that are serially connected, and configured to temporarily store data that is inputted to and outputted from the combinational logic circuit during ordinary operation, and to cause the plurality of flip-flops to function as shift registers to execute a scan shift that serially transfers test pattern data for a scan test during execution of a scan test; and
a clock gating circuit configured to control output of a pulse of a clock signal supplied to the scan chain circuit in accordance with a clock gating signal, whereas disable the clock gating signal based on a scan enable signal authorizing the scan shift, a portion of the flip-flops comprising:
a master latch that loads data while the clock signal falls; and
a slave latch that loads data while the clock signal rises, wherein while the scan enable signal is disabled, the portion of the flip-flops operate as flip-flops which transfer data at the master latch, to the slave latch by a rising edge of the clock signal, whereas while the scan enable signal is enabled, the portion of the flop-flops operate as flip-flops transfer the test pattern data at the slave latch to the master latch by a falling edge of the clock signal.

16. The semiconductor integrated circuit according to claim 15, wherein
the clock gating circuit outputs a gated-clock signal obtained by thinning the clock signal according to the clock gating signal during ordinary operation,
whereas the clock gating circuit outputs a clock signal without thinning out by disabling the clock gating signal during the scan shift operation.

17. The semiconductor integrated circuit according to claim 15, wherein
a portion of the flip-flops comprises:
a first multiplexer that selectively loads data inputted to and outputted from the combinational logic circuit to output the data to the master latch while the scan enable signal is disabled, whereas selectively loads an output signal from the slave latch to output the output signal to the master latch while the scan enable signal is enabled;
a second multiplexer that selectively loads an output signal from the master latch to output the output signal to the slave latch while the scan enable signal is disabled, whereas selectively loads the test pattern data to output the test pattern data to the slave latch while the scan enable signal is enabled; and
a third multiplexer that selectively loads an output signal from the slave latch while the scan enable signal is disabled, whereas selectively loads an output signal from the master latch while the scan enable signal is enabled.

18. The semiconductor integrated circuit according to claim 17, wherein
the clock gating circuit outputs a gated-clock signal obtained by thinning the clock signal according to the clock gating signal during ordinary operation,
whereas the clock gating circuit outputs a clock signal without thinning out by disabling the clock gating signal during the scan shift operation.

* * * * *